US 6,744,630 B2

(12) United States Patent
Hutchinson et al.

(10) Patent No.: US 6,744,630 B2
(45) Date of Patent: Jun. 1, 2004

(54) VARIABLE LENGTH AND DIRECTIONAL COOLING DUCT

(75) Inventors: David F. Hutchinson, Round Rock, TX (US); Matthew J. McGowan, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 10/175,638

(22) Filed: Jun. 20, 2002

(65) Prior Publication Data

US 2003/0235033 A1 Dec. 25, 2003

(51) Int. Cl.[7] .................................................. G06F 1/20
(52) U.S. Cl. .................... 361/687; 361/697; 312/236; 454/184; 415/213.1; 165/120
(58) Field of Search .............................. 361/687, 695, 361/694, 690, 697; 312/236; 454/184, 119; 165/120–126; 415/177, 178, 213.1, 214.1

(56) References Cited

U.S. PATENT DOCUMENTS

| 5,193,523 A | * | 3/1993 | Denber ....................... 454/184 |
| 5,828,549 A | | 10/1998 | Gandre et al. |
| 5,917,697 A | * | 6/1999 | Wang .......................... 361/695 |
| 6,005,770 A | | 12/1999 | Schmitt |
| 6,031,717 A | | 2/2000 | Baddour et al. |
| 6,031,719 A | | 2/2000 | Schmitt et al. |
| 6,058,009 A | | 5/2000 | Hood, III et al. |
| 6,064,570 A | | 5/2000 | Wang et al. |
| 6,222,264 B1 | | 4/2001 | O'Neal et al. |
| 6,236,565 B1 | * | 5/2001 | Gordon ....................... 361/695 |
| 6,257,832 B1 | | 7/2001 | Lyszkowski et al. |
| 6,270,319 B1 | | 8/2001 | Lyszkowski et al. |
| 6,404,630 B1 | * | 6/2002 | Lai ............................. 361/697 |
| 6,464,578 B1 | * | 10/2002 | Chin et al. .................. 454/184 |
| 6,567,267 B1 | * | 5/2003 | Wang .......................... 361/695 |

* cited by examiner

Primary Examiner—Lisa Lea-Edmonds
(74) Attorney, Agent, or Firm—Haynes and Boone, LLP

(57) ABSTRACT

A computer includes a chassis, a heat generating component mounted in the chassis and an airflow generating component mounted in the chassis. A flexible and variable length duct extends between the heat generating component and the airflow generating component. A first shroud is connected to a first terminal end of the duct and is mounted adjacent the heat generating component. A second shroud is connected to a second terminal end of the duct and is mounted adjacent the airflow generating component. As a result, a change of position of the heat generating component relative to the position of the airflow generating component is easily accommodated by the duct.

20 Claims, 5 Drawing Sheets

# VARIABLE LENGTH AND DIRECTIONAL COOLING DUCT

BACKGROUND

The disclosures herein relate generally to computer systems and more particularly to cooling such systems.

As the value and use of information continue to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Variations in chassis location along with variations in chassis form factor warrant the need for multiple fan shrouds. Thermal inefficiencies are inherent with current shroud technology. Increased fan speeds are needed to cool systems but result in increased noise.

Currently, plastic shrouds are used to direct airflow across a heatsink for cooling purposes. However, several shroud designs are required to accommodate the various chassis in production by any manufacturer. This results in multiple design changes and increased manufacturing costs.

Therefore, what is needed is a duct that directs airflow between a system fan and a processor heatsink, which can be used in a variety of chassis form factors.

SUMMARY

One embodiment, accordingly, provides a movable cooling system including a flexible and variable length duct, a first shroud attached to a first terminal end of the duct and a second shroud attached to a second terminal end of the duct.

A principal advantage of this embodiment is that the flexible and variable length duct permits movement of the first and second shrouds to various positions within the chassis.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
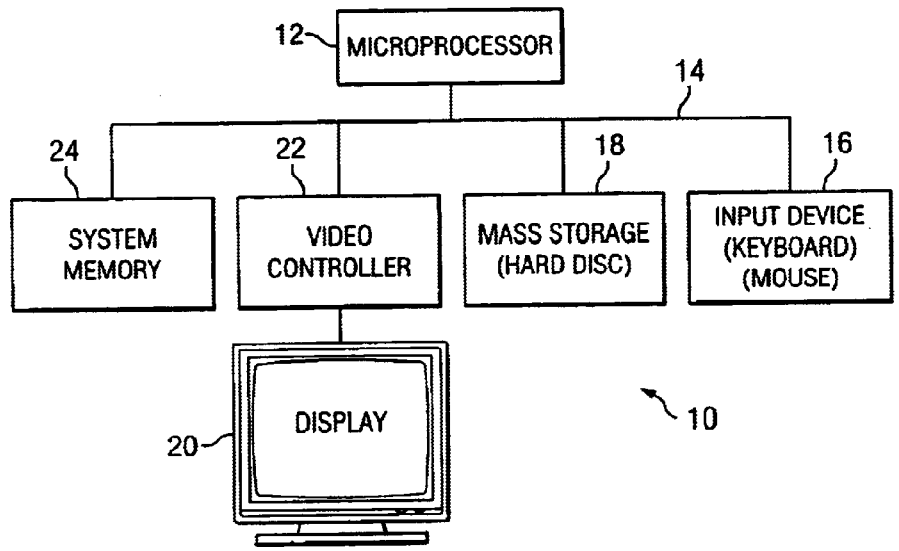
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
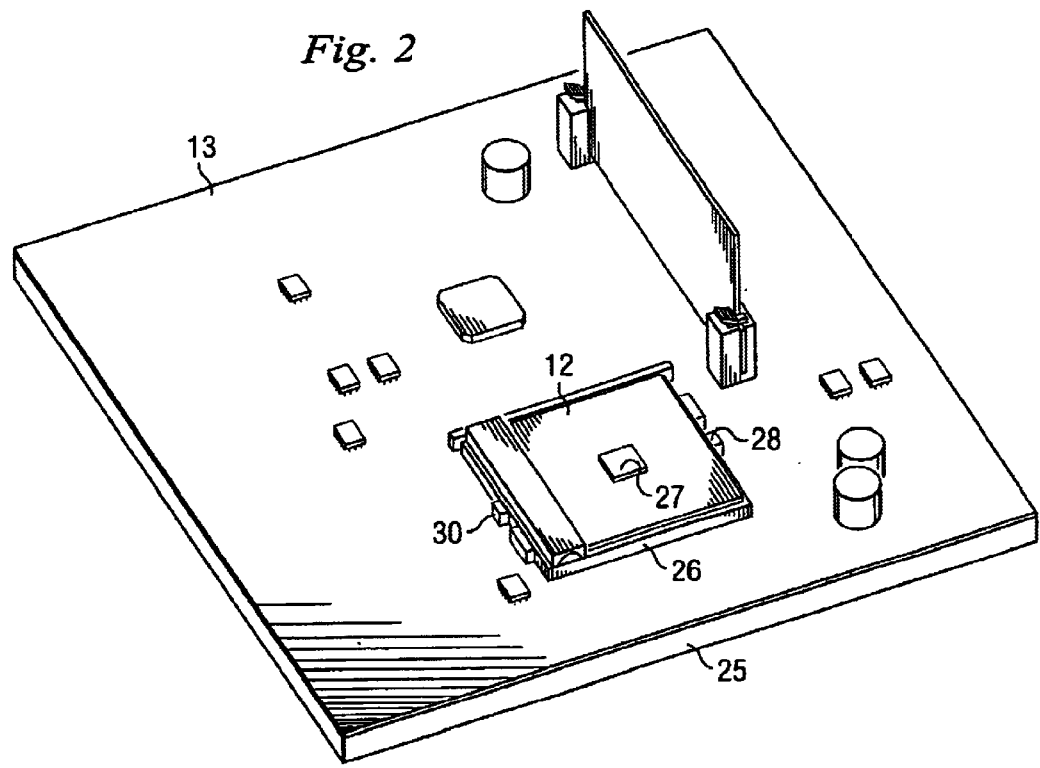
FIG. 2 is a view illustrating an embodiment of a microprocessor mounted on a support base seated in a computer chassis.

A chassis 25, FIG. 2, supports several of the components of computer system 10. In addition, a motherboard 13 is mounted in chassis 25 and a support base 26 is mounted on and electrically connected to the motherboard 13. Microprocessor 12 is mounted on the support base 26. A die 27 is a raised portion of the microprocessor 12 through which heat generated by the microprocessor 12 is concentrated for contact with a heat sink, or the like (discussed below). The support base 26 includes a support base first end 28 and a support base second end 30.

Figure 3:
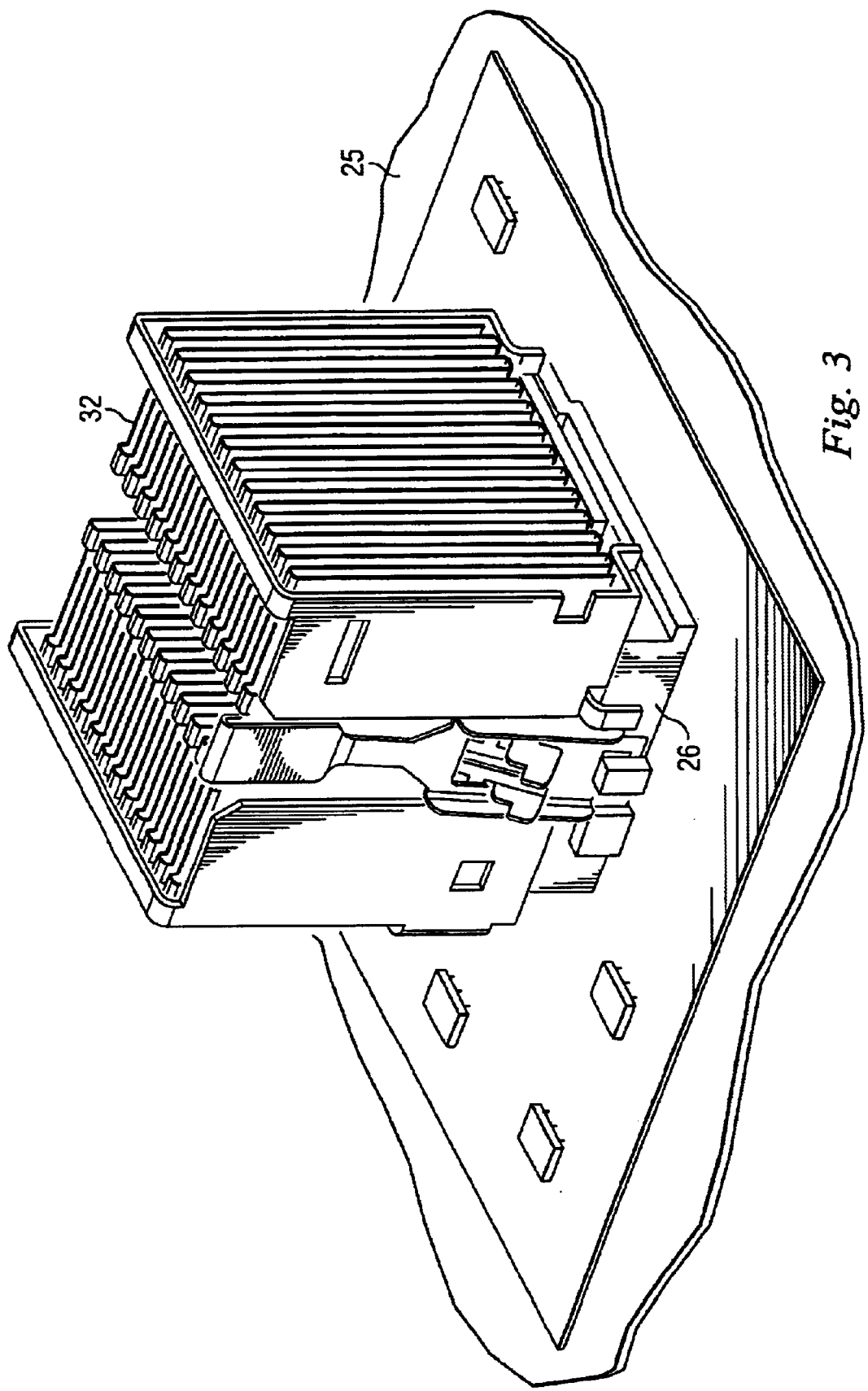
FIG. 3 is a perspective view of an embodiment of a heat sink mounted on the microprocessor and the support base.

In FIG. 3, a heat sink 32 is mounted on the support base 26 of chassis 25 and retained in place by a resilient clip member 34, or by some other suitable means, sufficient to create a downward force and maintain the heat sink 32 in contact with the microprocessor 12 mentioned above and not visible in FIG. 3.

Figure 4:
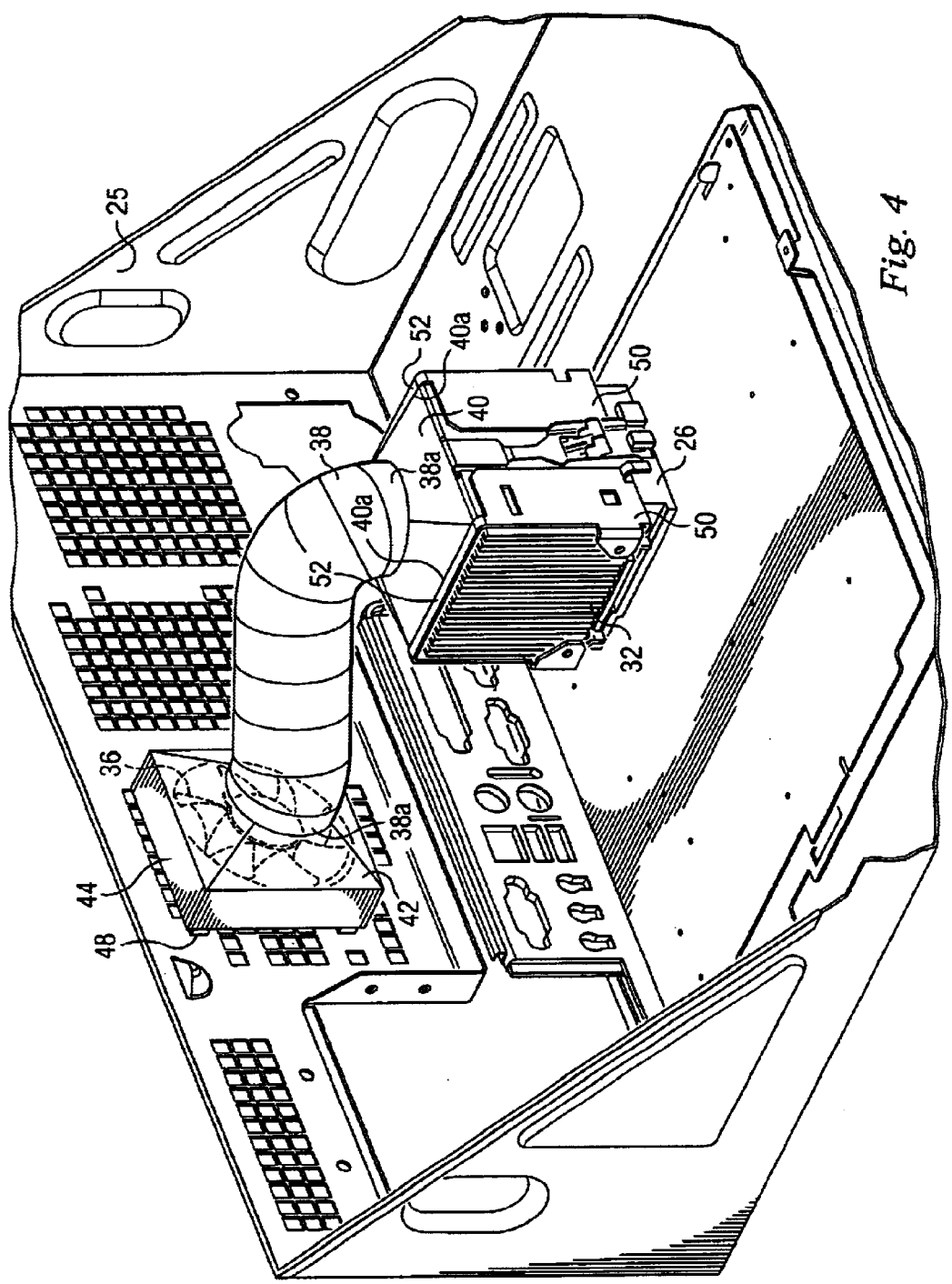
FIG. 4 is a perspective view of an embodiment of a cooling duct mounted in the chassis and interconnecting a fan housing and a heat sink.

In FIG. 4, the computer chassis 25 includes the heat sink 32 which along with the microprocessor 12, not visible in FIG. 4, is a heat generating component when the computer system 10 is operating. A fan 36, or other suitable airflow generating component is also mounted in chassis 25. A flexible and variable length duct 38 extends between the heat sink 32 and the fan 36. A first shroud 40 is connected to a first terminal end 38a of duct 38, and a second shroud 42 is connected to a second terminal end 38b of duct 38. The first shroud 40 is mounted adjacent the heat sink 32 and the second shroud 42 is mounted adjacent fan 36.

Figure 5:
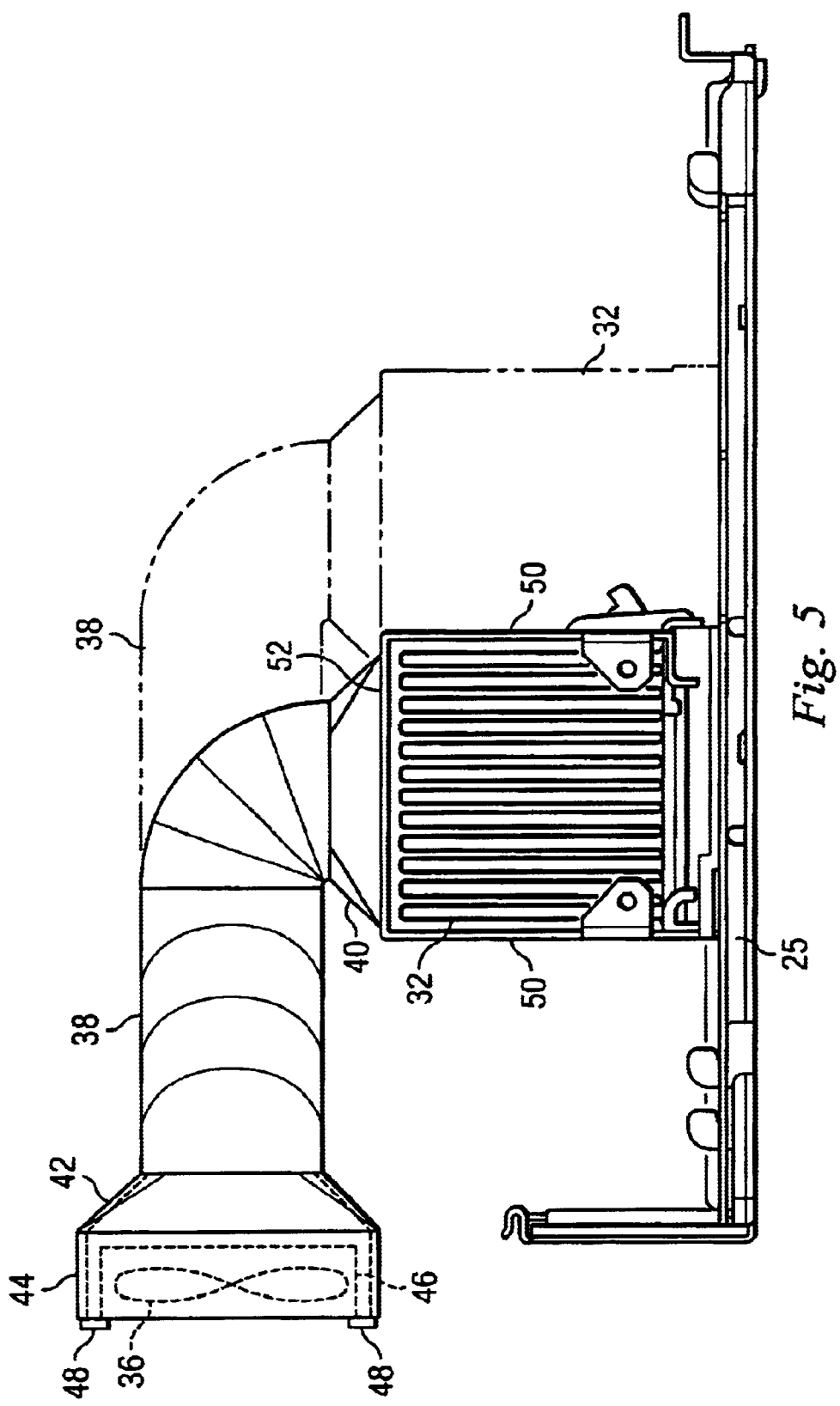
FIG. 5 is another view of the cooling duct of FIG. 4.
Figure 6:
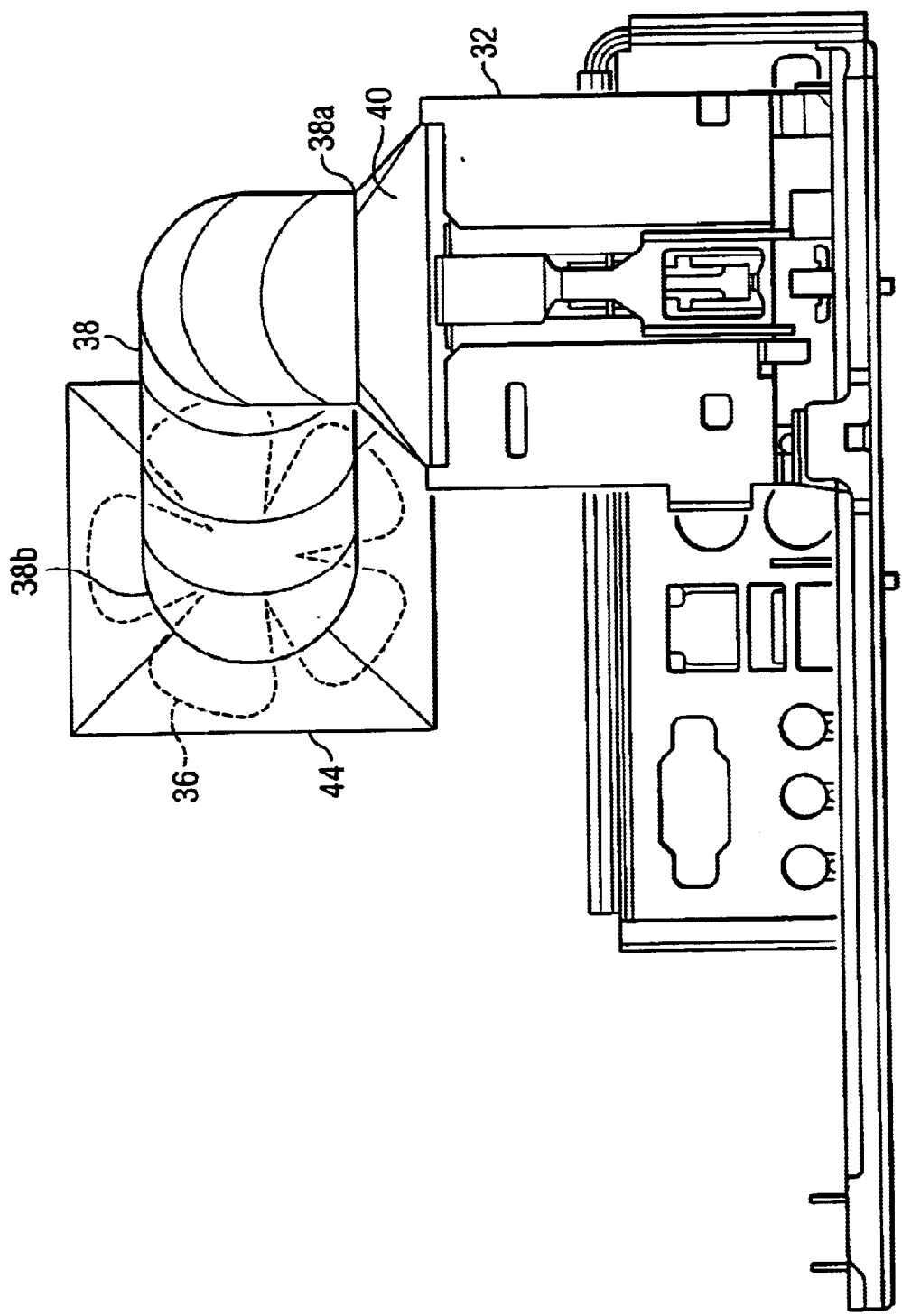
FIG. 6 is a further view of the cooling duct of FIG. 4.

The duct 38, FIGS. 4, 5 and 6, is of a construction which permits variable length and flexibility, such as by being formed in an accordion fashion or in segments or pleats. In this manner, relocating the support base 26 or the fan 36 in chassis 25, does not require additional ducting due to the flexibility of duct 38, see especially FIG. 5, which illustrates relocation of heat sink 32 on chassis 25, and an increased length of duct 38, as illustrated in phantom. Also, as illustrated in FIGS. 4 and 6, heat sink 32 is offset from fan 36 such that the flexibility of duct 38 is beneficial.

Shroud 42, FIGS. 4 and 5, includes a skirt 44 which seats on a fan housing 46 for fan 36. Clips 48, may be used to attach skirt 44 onto housing 46. Other suitable means may be used also, however, it is preferred that a snap-on-and-off type of attachment be used. Shroud 40 is attached to heat sink 32 by means of a pair of cover plates 50 which are mounted on heat sink 32. Each plate 50 includes an elongated portion 52 which secures an edge 40a of shroud 40 to the heat sink 32. Also, a snap-on skirt such as that provided at 44 may also be added to shroud 40 if desired.

Each shroud 40 and 42 includes a convex surface and a concave surface. For brevity, only the shroud 40, FIG. 6 will be discussed, although it is to be understood that this discussion applies to shroud 44 as well. In FIG. 6, shroud 40 includes a convex or outer surface and a concave or inner surface. Terminal end 38a of duct 38 is attached to the convex surface. The terminal end 38b of duct 38 is similarly attached to shroud 42.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A movable cooling system comprising:
a flexible and variable length duct;
a first shroud attached to a first terminal end of the duct;
a second shroud attached to a second terminal end of the duct;
a fan housing having receivers mounted thereon; and
one of the shrouds being connected to the receivers in a snap on and off connection, whereby the duct is quickly connected and disconnected.

2. The system as defined in claim 1 further comprising:
an attachment member on each shroud.

3. The system as defined in claim 1 further comprising:
a skirt extending from at least one of the shrouds.

4. The system as defined in claim 1 wherein each shroud includes a concave surface and a convex surface.

5. The system as defined in claim 4 wherein the duct is connected to the convex surface of each shroud.

6. A computer comprising:
a chassis;
a heat generating component mounted in the chassis;
an airflow generating component mounted in the chassis;
a flexible and variable length duct extending between the heat generating component and the airflow generating component;
a first shroud connected to a first terminal end of the duct and mounted adjacent the heat generating component;
a second shroud connected to a second terminal end of the duct and mounted adjacent the airflow generating component;
a fan housing having receivers mounted thereon; and
one of the shrouds being connected to the receivers in a snap on and off connection, whereby the duct is quickly connected and disconnected.

7. The computer as defined in claim 6 further comprising:
an attachment member interconnecting each shroud to its respective component.

8. The computer as defined in claim 6 further comprising:
a skirt extending from at least one of the shrouds.

9. The computer as defined in claim 6 wherein each shroud includes a concave surface and a convex surface.

10. The computer as defined in claim 9 wherein the duct is connected to the convex surface of each shroud.

11. An information handling system comprising:
a chassis;
a microprocessor mounted in the chassis;
a storage coupled to the microprocessor;
an airflow generating component mounted in the chassis;
a flexible and variable length duct extending between the microprocessor and the airflow generating component;
a first shroud connected to a first terminal end of the duct and mounted adjacent the microprocessor;
a second shroud connected to a second terminal end of the duct and mounted adjacent the airflow generating component;
a fan housing having receivers mounted thereon; and
one of the shrouds being connected to the receivers in a snag, on and off connection, whereby the duct is quickly connected and disconnected.

12. The system as defined in claim 11 further comprising:
an attachment member on each shroud.

13. The system as defined in claim 11 further comprising:
a skirt extending from at least one of the shrouds.

14. The system as defined in claim 11 wherein each shroud includes a concave surface and a convex surface.

15. The system as defined in claim 14 wherein the duct is connected to the convex surface of each shroud.

16. The system as defined in claim 11 further comprising:
a heat sink mounted on the microprocessor; and
the first shroud mounted adjacent the heat sink.

17. A method of cooling a computer system comprising:
providing a chassis; mounting a heat generating component in a first portion of the chassis;
mounting an airflow generating component in a second portion of the chassis;
extending a flexible and variable length duct between the heat generating component and the airflow generating component;
connecting a first shroud to a first terminal end of the duct;
mounting the first shroud adjacent the heat generating component;
connecting a second shroud to a second terminal end of the duct;
mounting the second shroud adjacent the airflow generating component;

providing a fan housing having receivers mounted thereon; and connecting one of the shrouds to the receivers in a snag on and off connection, whereby the duct is quickly connected and disconnected.

18. The method as defined in claim 17 further comprising:
mounting an attachment member on each shroud.

19. The method as defined in claim 17 further comprising:
extending a skirt from at least one of the shrouds.

20. The method as defined in claim 17 wherein each shroud includes a concave surface and a convex surface, and the duct is connected to the convex surface of each shroud.

* * * * *